United States Patent [19]

Kobayashi et al.

[11] Patent Number: 5,724,036
[45] Date of Patent: Mar. 3, 1998

[54] DIGITAL-TO-ANALOG CONVERTER WITH GAMMA COMPENSATION AND A LIQUID CRYSTAL DISPLAY DEVICE USING SAME

[75] Inventors: Yoshinao Kobayashi, Hiratsuka; Yoshitami Sakaguchi, Yokohama, both of Japan

[73] Assignee: International Business Machines Corporation, Armonk, N.Y.

[21] Appl. No.: 523,654

[22] Filed: Sep. 5, 1995

[30] Foreign Application Priority Data

Sep. 5, 1994 [JP] Japan ................. 6-211214

[51] Int. Cl.$^6$ ................................. H03M 1/84
[52] U.S. Cl. ................. 341/138; 341/137; 341/144
[58] Field of Search ..................... 341/138, 144, 341/137; 348/674; 345/98

[56] References Cited

U.S. PATENT DOCUMENTS

| | | | |
|---|---|---|---|
| 4,752,767 | 6/1988 | Maio et al. | 340/347 DA |
| 4,760,313 | 7/1988 | Mallinson | 315/367 |
| 5,459,531 | 10/1995 | Park | 348/675 |
| 5,483,256 | 1/1996 | Ohi | 345/98 |

*Primary Examiner*—Jeffrey A. Gaffin
*Assistant Examiner*—Jason L. W. Kost
*Attorney, Agent, or Firm*—Scully, Scott, Murphy & Preser

[57] ABSTRACT

A DAC is disclosed that includes a decoder having output lines corresponding to digits of digital data. The decoder generates an output corresponding to the value of the digital data on the output lines. The DAC further includes a constant current source, and output means connected to the constant current source for providing an output voltage by a flowing current. The DAC also has driver transistors, where each transistor is connected to one of the decoder output lines and to the constant current source. The output means conducts a current from the constant current source when the connected output line is activated. Current limit transistors are each connected to each one of the driver transistors. The decoder output lines are grouped so as to correspond to each of the ranges of a gamma compensation curve. A common reference voltage for each group is applied to a control terminal of the current limiting transistors associated with the output lines in each group.

10 Claims, 5 Drawing Sheets

DIGITAL-TO-ANALOG CONVERTER WITH GAMMA COMPENSATION AND A LIQUID CRYSTAL DISPLAY DEVICE USING SAME

FIELD OF THE INVENTION

The present invention is related to an apparatus for driving a liquid crystal display device (LCD), and particularly to a D/A converter (DAC) with gamma compensation.

BACKGROUND OF THE INVENTION

Since, in a display device such as a CRT or LCD, the input voltage and emission output are not in a linear relationship, a gamma (γ) compensation is performed for digital data or analog data.

There is a method in which digital data is compensated by a gamma compensation using a look-up table or the like (for instance, PUPA 5-80713), and the data compensated by a gamma compensation is input to a DAC. This method has good stability, but has a disadvantage that accuracy decreases by about 2 bits. That is, even if a DAC of 8 bits is used, the gray scales which can be expressed are those of about 6 bits.

Also, there is a method in which digital data is decoded and switches for outputting reference voltages compensated by a gamma compensation are turned on/off by the decoding result. This method is effective if the number of gray scales is small, but, if the number of gray scales increases, the number of reference voltages increase or several bits of the input are discarded, thereby reducing the effective accuracy as in the above described method.

This is a method in which non-linear elements are used to implement a gamma compensation of analog data after a D/A conversion by a DAC. Gray scales are maintained if the gamma compensation is successfully performed, but it is difficult to accurately perform the gamma compensation because analog elements are used. In addition, there is a disadvantage that it is difficult to acquire stability against temperature.

SUMMARY OF THE INVENTION

Accordingly, it is an object of the present invention to provide a DAC which is highly stable and can perform an accurate gamma compensation with a high effective accuracy.

It is also an object to provide a liquid crystal display device which accomplishes the above object.

To accomplish the above objects, the present invention is a D/A converter for converting digital data read from a frame buffer for each pixel of a display screen to analog data compensated by gamma compensation, wherein a curve of the gamma compensation is divided to a plurality of ranges sufficient to approximate the curve, comprising: a decoder having a plurality of output lines corresponding to a number of digits of said digital data, and generating an output corresponding to said digital data on said plurality of output lines; a constant current source; output means connected to said constant current source for providing an output voltage by a flowing current; a plurality of driver transistors, each connected to one of said plurality of output lines of said decoder and to said constant current source for conducting a current from said constant current source when said connected output line is active; a plurality of limit transistor, each connected to one of said plurality of driver transistors; and wherein said plurality of output lines of said decoder are grouped correspondingly to each of said plurality of ranges, and a common reference voltage in each group is applied to control terminals of said limit transistors associated with said output lines in each of said groups. This allows the current flowing through transistors to be limit for each group to perform an effective approximation. In addition, since the current control is not performed for each transistor, the number of the reference voltages can be made small.

Further, another aspect of the present invention may be a D/A converter for converting digital data read from a frame buffer for each pixel of a display screen to analog data compensated by gamma compensation, wherein a curve of the gamma compensation is divided to a plurality of ranges sufficient to approximate the curve, comprising: a decoder having a plurality of output lines corresponding to a number of digits of said digital data, and generating an output corresponding to said digital data on said plurality of output lines; a constant current source; output means connected to said constant current source for providing an output voltage by a flowing current; a plurality of driver transistors, each connected to one of said plurality of output lines of said decoder and to said constant current source for conducting a current from said constant current source when said connected output line is active; a plurality of limit transistor, each connected to one of said plurality of driver transistors; and wherein said plurality of output lines of said decoder are grouped correspondingly to each of said plurality of ranges, and a reference voltage for defining a current limited by said current limit transistors associated with said output lines in each group is supplied to said each group.

The reference voltage corresponds to a differentiated value at a point in said each corresponding range of said curve. This can provide the output which is obtained if each range of the gamma compensation curve is directly approximated. As to the reference voltage, each reference voltage may be generated by resistive division. It may be also possible that reference voltage reference pins are set when the DAC of the present invention is implemented by an IC or the like, and reference voltages are given to the pins.

Further, it may be possible that corresponding to one of said groups is applied to a control terminal of said current limit transistor associated with the least significant output of said decoder in said one of said groups, and the respective adjacent control terminals between its current limit transistor and said current limit transistor associated with the least significant output of said decoder in the higher-order group adjacent to said one of said groups are connected through resistors, and a respectively generated voltage is supplied to the control terminal of each said current limit transistor. By this, each range of the gamma compensation curve is represented by the envelope of a quadratic curve.

Further, it may be possible that the reference voltage corresponding to one of said groups is applied to a control terminal of said current limit transistor associated with the least significant output of said decoder in said one of said groups, to the control terminal of said current limit transistor associated with the second least significant output, and to the control terminal of said current limit transistor associated with the most significant output of said decoder in the lower-order group adjacent to said one of said groups, and the respective adjacent control terminals between said current limit transistor associated with the second significant output and said current limit transistor associated with the most significant output of said decoder in said one of said groups are connected through resistors, and a respectively generated voltage is applied to the control terminal of each said current limit transistor. The gamma compensation curve can be represented by the envelope of straight lines and quadratic curves.

Further, the reference voltage corresponding to one of said groups is applied to a control terminal of said current limit transistor associated with the least significant output of said decoder in said one of said groups, to the control terminals of said current limit transistors for said driver transistors connected up to the output of an order higher than said least significant output by a predetermined number, and to the control terminals of said current limit transistors for said driver transistors connected up to the output of an order lower than said most significant output of said decoder by a predetermined number in the lower-order group adjacent to said one of said groups, and the respective adjacent control terminals between said current limit transistor associated with the output of an order higher than said least significant output by the predetermined number and said current limit transistor associated with the output of an order lower than said most significant output of said decoder by the predetermined number in said one of said group are connected through resistors, and the respectively generated voltage is applied to the control terminal of each said current limit transistor.

This is provided by standardizing the above case in which the gamma compensation curve is expressed by straight lines and quadratic curves. This allows the creation of a curve approximate to the true gamma compensation curve.

Further, the gamma compensation curve can also be represented by straight lines, quadratic curves, and a combination of straight lines and quadratic curves.

Further, another aspect of the present invention may be a liquid crystal display device which includes the D/A converter of the present invention, and has a liquid crystal panel including a circuit which drives each data line using the output voltage of the output means of the D/A converter.

In addition, another aspect of the present invention may be a liquid crystal display device which includes the D/A converter of the present invention in a plural number, and has a liquid crystal panel including a circuit which uses each output voltage of the plurality of D/A converter circuits to drive the data lines of each D/A converter circuit which are associated with the corresponding portion of each display screen.

DETAILED DESCRIPTION OF THE PREFERRED EMBODIMENTS

Figure 1:
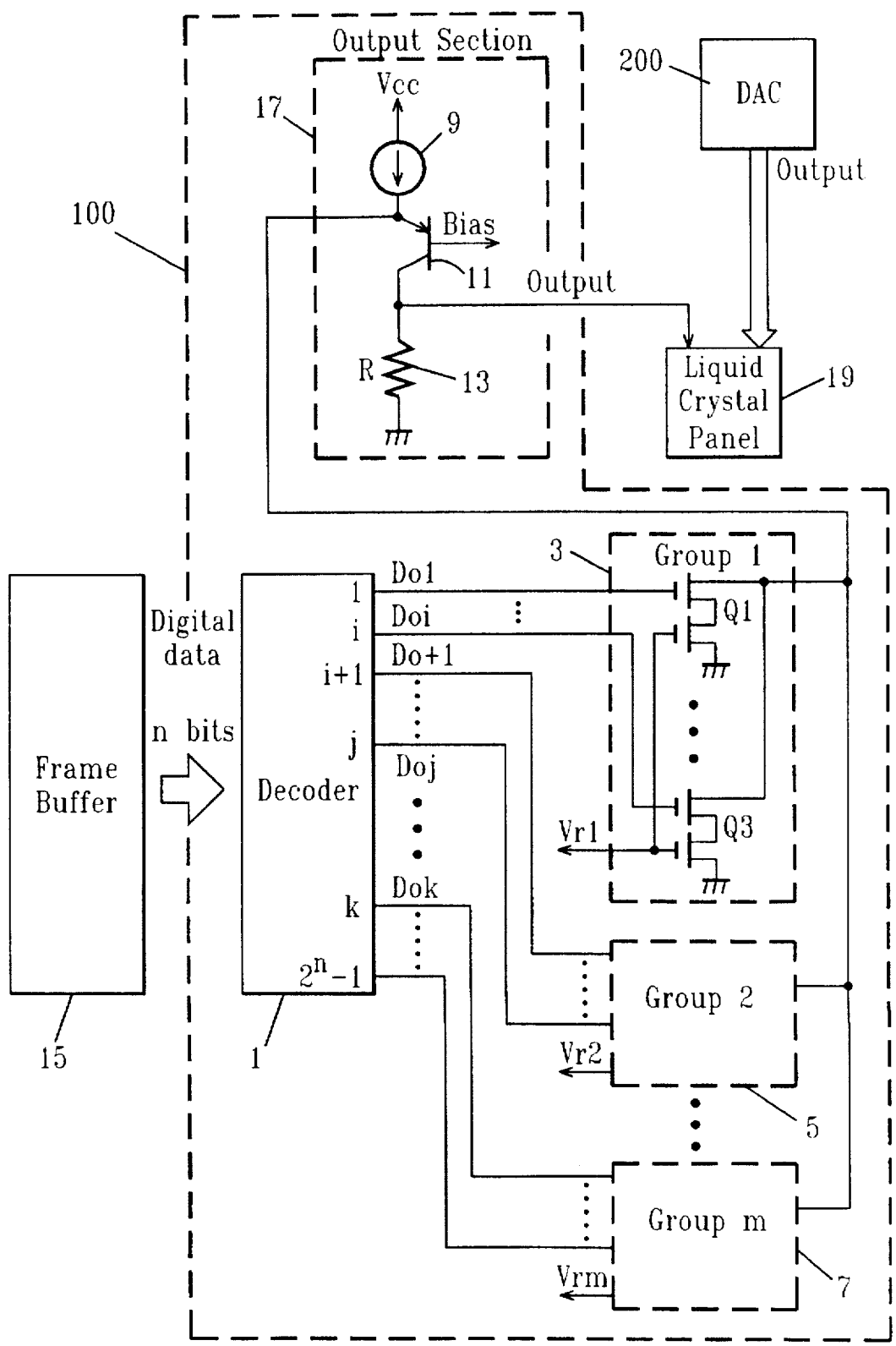
FIG. 1. is a block diagram of the general construction of the present invention.

In FIG. 1, a schematic diagram of the present invention 100 is shown. The n-bit digital data from a frame buffer 15 is input to a decoder 1. Since the input is an n-bit input, the outputs of the decoder 1 are $2^n-1$ (there is no output when the input is zero). In this instance, they are Do1 to Do$2^n-1$. These outputs are connected to the gate of one transistor, respectively. $2^n-1$ transistors are arranged in the conventional DAC as described above, and a necessary number of transistors of these transistors are sequentially turned on. In the present invention, current limiting transistors (in FIG. 1, Qi, where i is an integer from one to $2^n-1$) are connected to those transistors, respectively. The set of two transistors represents one bit. A predetermined number of the sets of two transistors are collected, and treated as a group. The predetermined number is described later.

The same voltage is used as the gate voltages of the current limiting transistors in the same group. In FIG. 1, the gate voltage of the group 1 is Vr1. Similarly, the gate voltages of the groups 2 to m are Vr2 . . . Vrm (m: the number of groups). The gate voltage is also described later. The outputs of the groups are all connected to the emitter of a transistor 11. To the emitter of the transistor 11, a current source 9 is also connected. A bias voltage is applied to the base of the transistor 11, and a resistor 13 is connected to the collector thereof. As the output of the DAC, the voltage drop in the resistor 13 is used.

The output of the DAC is connected to a liquid crystal panel 19. The liquid crystal panel 19 includes a circuit for passing the analog data from the DAC to the respective data lines (signal lines) of the liquid crystal panel. There is a method in which the outputs of the DAC 100 of the present invention are passed to the all data lines of the liquid crystal panel, and a method in which the outputs of a plurality of DACs 200 and of the DAC 100 are passed together to the data lines. The latter method is effective, because it can apply to elements (including the DAC) whose operation frequency is low.

The operation of the present invention is as follows. The n-bit output from the frame buffer is input to the decoder 1. Decoding is performed in the decoder 1, and from one of the $2^n-1$ outputs, the outputs in a number corresponding to the value of the n bits are turned on. The outputs of the decoder 1 are turned on, the transistors connected to them are also turned on and a current flows from the current source 9. However, the current flowing through the transistors is limited by the current limiting transistors. When the transistors belonging to the groups 1 to m are turned on, respectively, a current flows in these transistors, and thus the current flowing through the transistor 11 having the output terminal gradually decreases. Accordingly, the output voltage also lowers. By passing the output voltage to the data lines of the liquid crystal panel 19, a desired image can be displayed.

Figure 2:
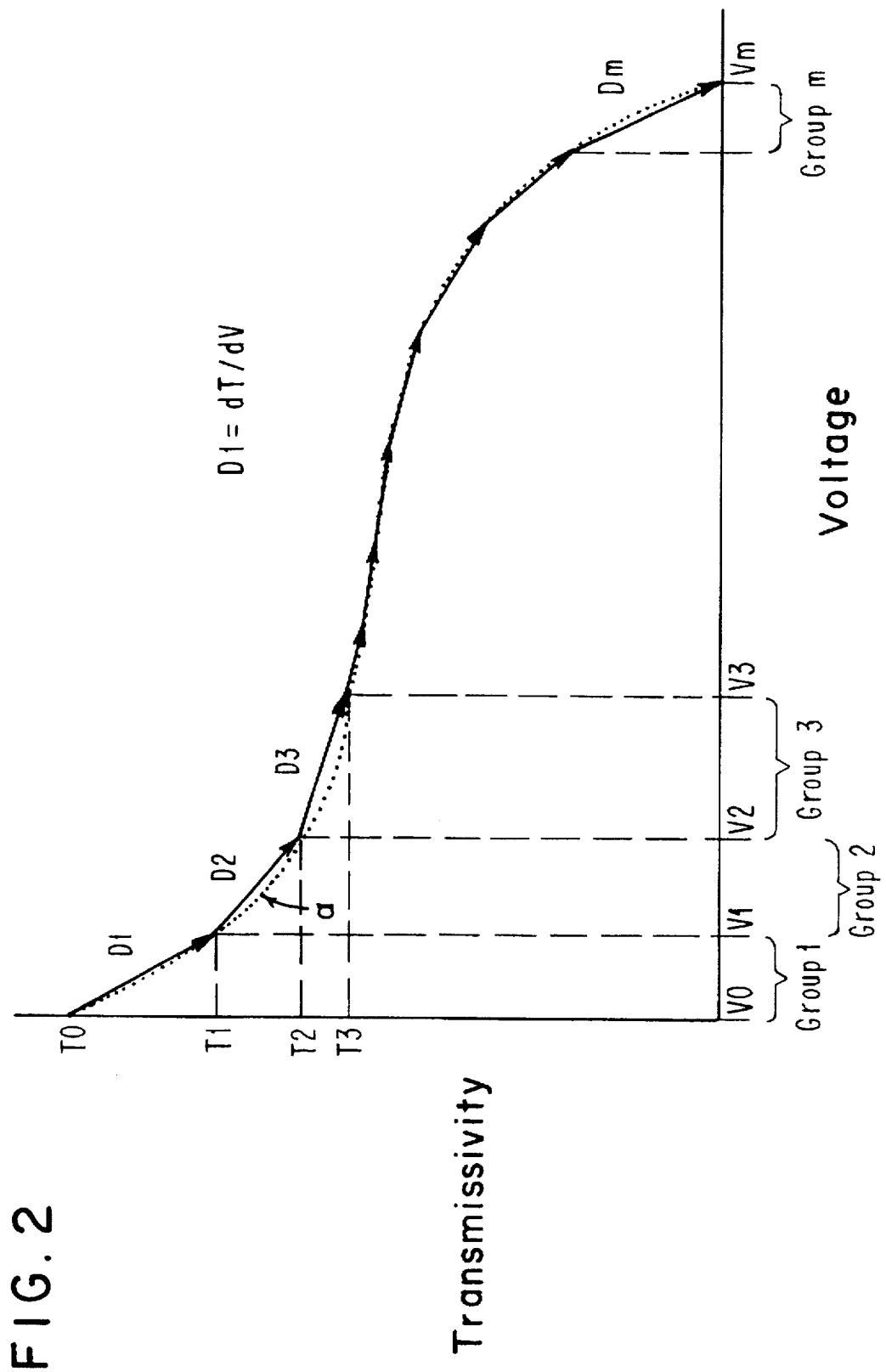
FIG. 2. is a graph showing a gamma compensation curve.

For the description of the above described predetermined number of transistors and gate voltages Vr, FIG. 2 is referred to. This figure is a gamma compensation curve which shows the relationship between the applied voltage and the transmissivity of liquid crystal. The dotted line a is a curve showing the actual transmissivity. On the other hand, to approximate the gamma compensation curve using straight lines, the line segments D1 to Dm are connected. That is, the gamma compensation curve a can be expressed by dividing it into m groups, and each group corresponds to each of the groups. The number of the transistors in each group corresponds to the potential difference represented by that group. That is, the required transistors increase as the voltage which must be covered by a group (for instance, in FIG. 2, the voltage between V0 and V1 is covered by the group 1) increases, and less transistors are required if the voltage is small. Since the gamma compensation curve is approximated by straight lines, the range which can be approximated by a straight line must be defined as one group. In consequence, the number of the transistors varies among groups. For more accurate approximation, the transistors should be divided into more groups, but the number of elements to be controlled increases as the number of division groups increases, causing a problem in the manufacturing. Thus, usually four to eight transistors form one group.

Figure 3:
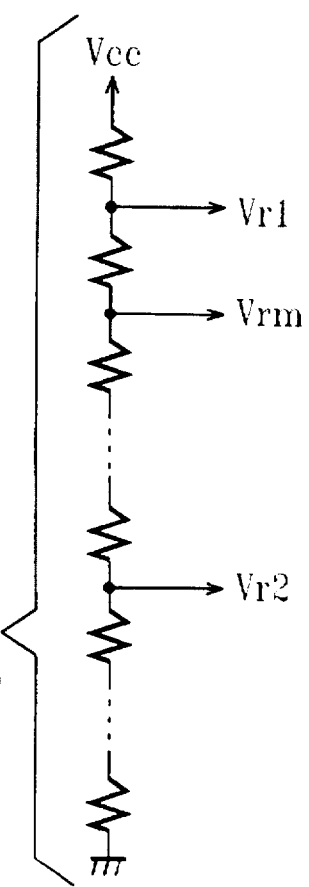
FIG. 3. is an example of the circuit for generating reference voltages.

As the gate voltage Vr, a voltage corresponding to the slope of the straight line in FIG. 2 of a particular group (actually, the absolute value of the slope, usually the absolute value of the differentiated value at a point) is used. That is, for the group 1, it is a voltage corresponding to the slope (absolute value) of D1. If the gate voltage of a current limiting transistor is set in this way, the voltage varies in the group without departing from that straight line. For providing the Vr in a mounting, there is also a method in which the decoder and the portions after the decoder are implemented by an IC, one I/O pins is provided for each group, and voltages set by a technique such as resistive division as in FIG. 3 are given to the I/O pins, respectively. However, any method for generating predetermined voltages may be used, and the inputting through I/O pins is not always needed. However, if the voltages can be set by I/O pins, change of the gamma compensation curve can be served.

If the transistors are divided into groups and the gate voltages of the current limiting transistors are set for each group, as described above, all the current limiting transistors can be controlled for each group without being controlled individually, whereby the gamma compensation curve can be approximated by straight lines. However, some portions are caused which largely differ from the true gamma compensation curve. Then, correction of them is performed by the following two variations.

Figure 4:
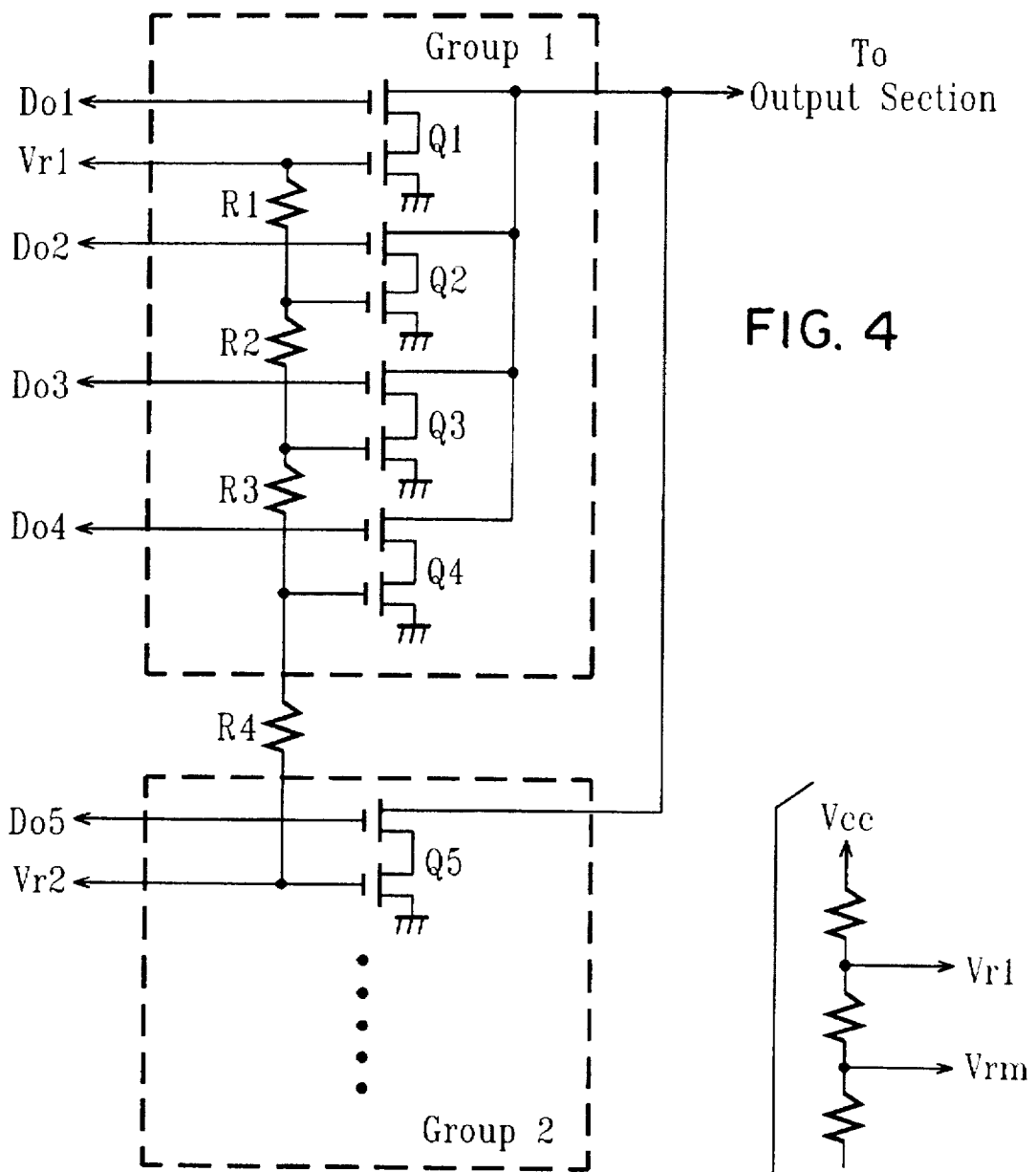
FIG. 4. is a figure showing the first variation of the present invention.

The first variation is shown in FIG. 4. This is a figure in which the decoder 1 and the output section 17 in 100 of FIG. 1 are omitted. In this case, a set of four transistors forms one group. The number of the sets of transistors is arbitrary as described above. A reference voltage Vr1 is input to the gate of the least significant current limiting transistor Q1 in the group 1. Similarly, a reference voltage Vr2 is input to the gate of the least significant current limiting transistor Q5 in the group 2. A resistive division using resistors R1, R2, R3 and R4 is performed between the two current limiting transistors. To the gates of the current limiting transistors Q2 to Q4 lying between the above gates, the voltages produced by the respective resistors are supplied, respectively.

By this, the voltages given to the gates of the current limiting transistors gradually change. The voltages are as follows if the resistors R1, R2, R3 and R4 are set to the same value for simplicity.

Q1: Vr1
Q2: (3*Vr1+1*Vr2)/4
Q3: (2*Vr1+2*Vr2)/4
Q4: (1*Vr1+3*Vr2)/4
Q5: Vr2

Naturally, in this case, the respective gate voltages are at equal intervals. The intervals may be changed by adjusting the resistors R1, R2, R3 and R4. Since the admittance of successive transistors linearly varies in this way, the resultant input/output characteristics have the envelope of a quadratic curve. In addition, the reference voltage Vr is a voltage which corresponds to the absolute value of the differentiated value at a point in the corresponding range of the gamma compensation curve.

Figure 5:
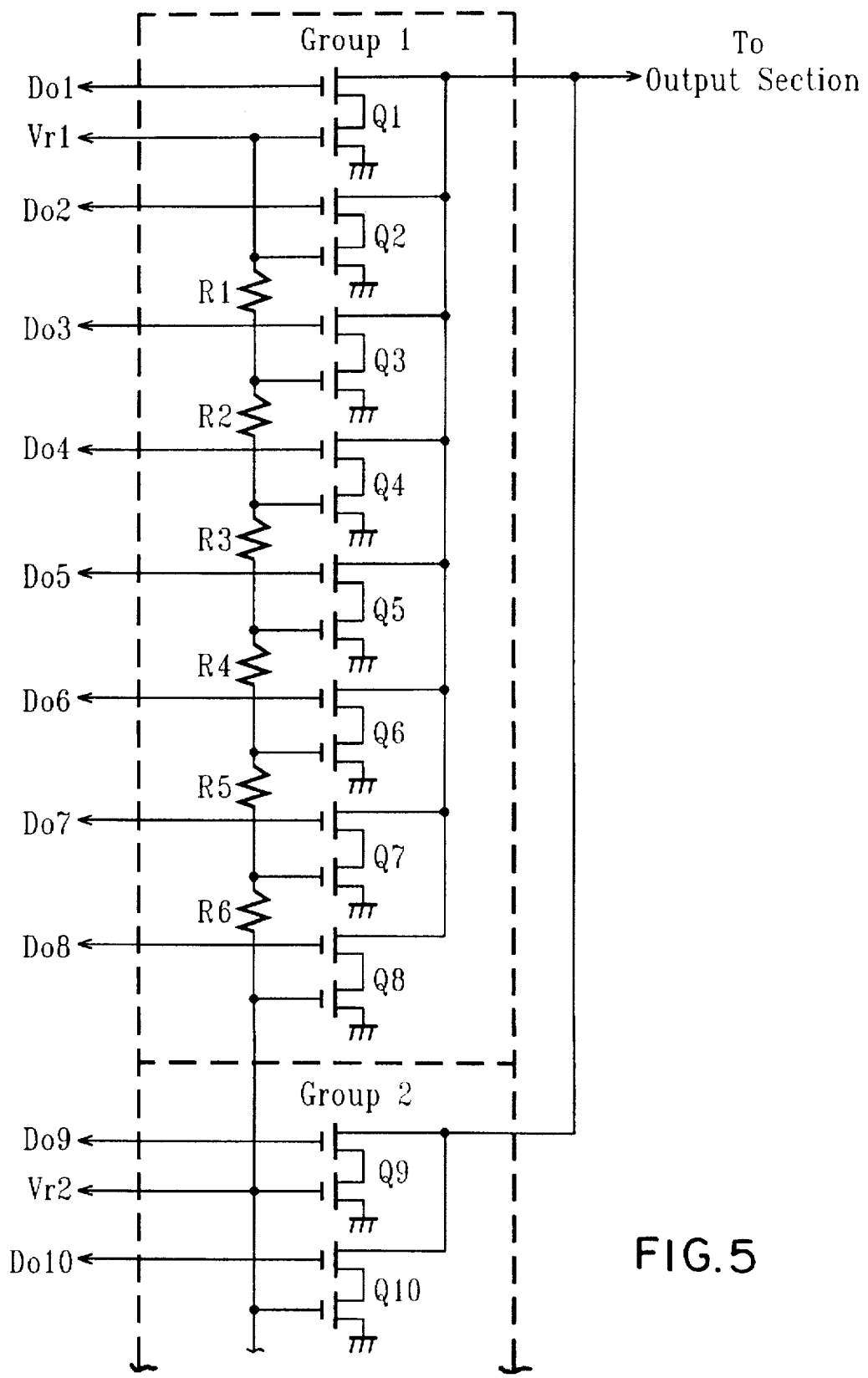
FIG. 5. is a figure showing the second variation of the present invention.

In FIG. 5, the second variation of the present invention is shown. In this figure, the decoder 1 and the output section 17 in FIG. 1 are also omitted. Further, in this embodiment, a set of eight transistors forms one group. The number of the sets of transistors is arbitrary as described above. A reference voltage Vr1 is supplied to the gate of the least significant current limiting transistor Q1 in the group 1, and also to the gate of the second least significant current limiting transistor Q2. Further, a reference voltage Vr2 is supplied to the least significant current limiting transistor Q9 in the group 2, and also to the gate of the most significant current limiting transistor Q8 in the group 1 and to the second least significant current limiting transistor Q10 in the group 2. In addition, between the gate of the second least significant current limiting transistor in the group 1 and the most significant current limiting transistor Q8 in the group 1, a resistive division is performed using resistors R1 to R6. To the gates of the current limiting transistors Q2 to Q7, the voltages generated by the respective resistors are supplied, respectively.

In this way, there can be provided portions where the gate voltage is linearly changed, and portions where it is changed in a curve. The gate voltages of the respective current limiting transistors are as follows if the resistors R1 to R6 are set to the same value for simplicity.

Q1: Vr1
Q2: Vr1
Q3: (5*Vr1+1*Vr2)/6
Q4: (4*Vr1+2*Vr2)/6
Q5: (3*Vr1+3*Vr2)/4
Q6: (2*Vr1+4*Vr2)/4
Q7: (1*Vr1+5*Vr2)/4
Q8: Vr2
Q9: Vr2
Q10: Vr2

Naturally, the gate voltages from Q2 to Q8 are at equal intervals. The intervals may be changed adjusting the values of the resistors. Since, in the admittance of the successive current limiting transistor, there are alternately appearing portions where the admittance is constant and portions where it linearly changes, as described above, the resultant input/output characteristics have the envelope synthesized by straight lines and quadratic curves. In addition, the reference voltage Vr is a voltage which corresponds to the absolute value of the differentiated value at the start point of the corresponding range of the gamma compensation curve (for instance, V0 in the group 1, V1 in the group 2).

In the second variation, the same reference voltage is supplied to the least significant current limiting transistor in a certain group, the second least significant current limiting transistor, and the most significant current limiting transistor in the lower-order group adjacent to the certain group, but the same reference voltage may be provided not only to both sides of the least significant current limiting transistor in the certain group in this way, but also to a predetermined number of adjacent current limiting transistors according to the gamma compensation curve.

As described above, the methods have been shown in which the gamma compensation curve is approximated by straight lines, quadratic curves, and straight lines and quadratic curves, but, if not only these methods are used to approximate the gamma compensation curve, but also approximation methods suitable for the respective ranges are used when the gamma compensation curve is divided into ranges, more preferred approximations can be performed.

Figure 6:
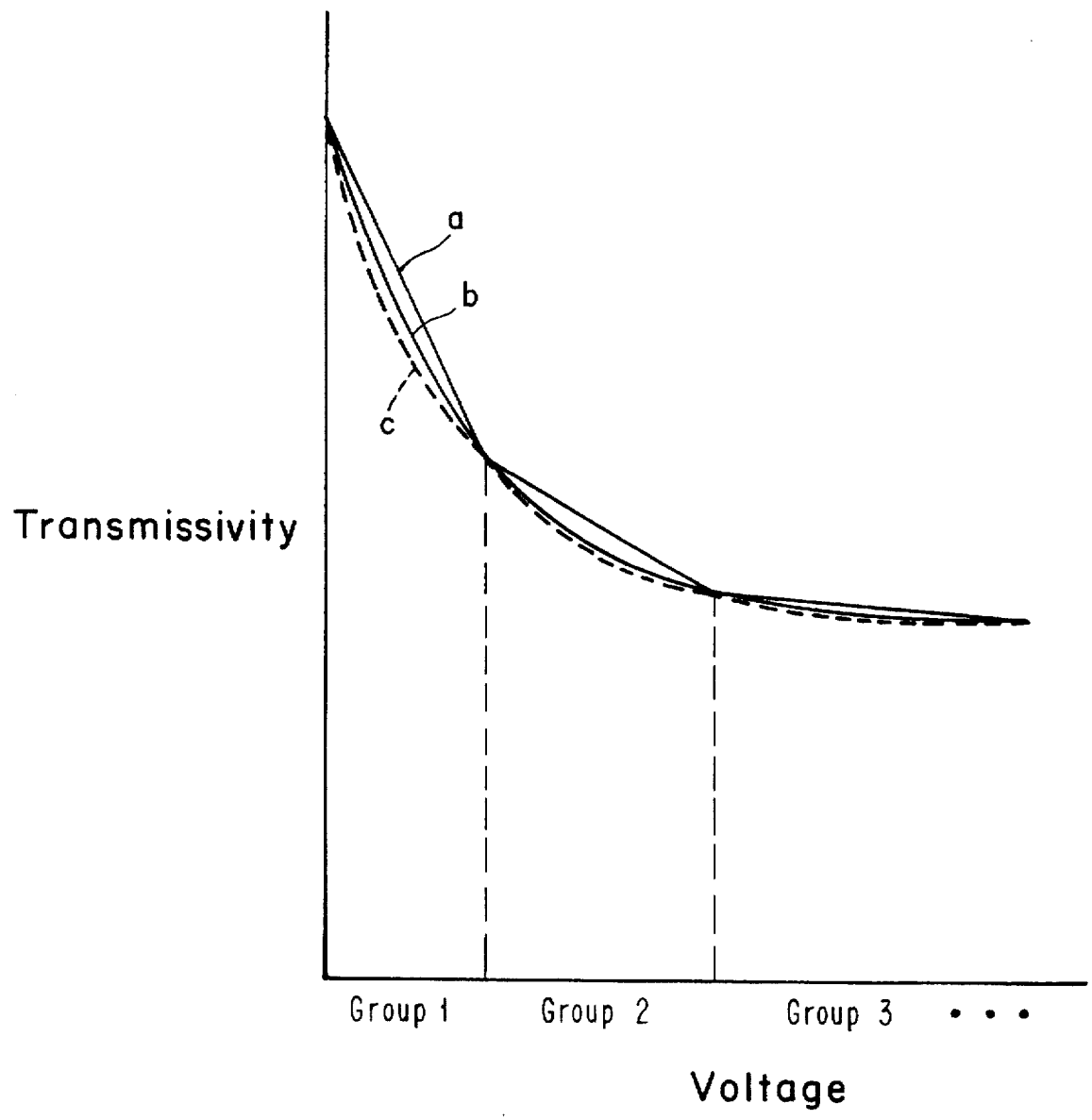
FIG. 6. is a graph showing an example of the gamma compensation curve when the present invention is applied.

FIG. 6 shows how the above three types of approximations are different. "a" shows the approximation by straight lines, "b" shows the approximation by quadratic curves, and "c" shows the approximation by the envelope of straight lines and quadratic curves. Since there are differences as in FIG. 6, combination of them gives an approximation closer to the true gamma compensation curve than the approximation by only one method. However, the construction is simple for the approximation by straight lines and sometimes there is no problem with straight lines, and thus consideration should also be made from the viewpoint of cost.

Furthermore, although, in the first and second variations, a resistive division is made to provide a voltage to the gate of each current limiting transistor, the values of the resistors in the resistive division can be varied and resistors may even be removed to cause a short circuit. In this case, the short-circuited sections are approximated by straight lines. Thus, it may be considered that there is a first control of externally providing a reference voltage, and a second control of how to provide the reference voltage to the gate of each current limiting transistor.

As described above, in accordance with the present invention, a DAC may be provided which is highly stable and can perform accurate gamma compensation with high effective accuracy.

A liquid crystal display device may be provided which uses the DAC that produces the remarkable advantages as described above.

We claim:

1. A D/A converter for converting digital data read from a frame buffer for each pixel of a display screen to analog data compensated by a gamma compensation, wherein a curve of the gamma compensation is divided to a plurality of ranges sufficient to approximate the curve, comprising:

a constant current source;

output means connected to said constant current source for providing an output voltage by a flowing current;

a plurality of driver transistors, each connected to one of said plurality of output lines of said decoder and to said constant current source for conducting a current from said constant current source when said connected output line is active;

a plurality of limit transistor, each connected to one of said plurality of driver transistors; and wherein said plurality of output lines of said decoder are grouped correspondingly to each of said plurality of ranges, and a common reference voltage in each group is applied to control terminals of said limit transistors associated with said output lines in each of said groups.

2. D/A converter for converting digital data read from a frame buffer for each pixel of a display screen to analog data compensated by a gamma compensation, wherein a curve of the gamma compensation is divided to a plurality of ranges sufficient to approximate the curve, comprising:

a constant current source;

output means connected to said constant current source for providing an output voltage by a flowing current;

a plurality of driver transistors, each connected to one of said plurality of output lines of said decoder and to said constant current source for conducting a current from said constant current source when said connected output line is active;

a plurality of limit transistor, each connected to one of said plurality of driver transistors; and wherein said plurality of output lines of said decoder are grouped correspondingly to each of said plurality of ranges, and a reference voltage for defining a current limited by said current limit transistors associated with said output lines in each group is supplied to said each group.

3. A D/A converter according to claim 2 wherein said reference voltage corresponds to a differentiated value at a point in said each corresponding range of said curve.

4. A D/A converter according to claim 3 wherein said reference voltage corresponding to one of said groups is applied to a control terminal of said current limit transistor associated with the least significant output of said decoder in said one of said groups, and the respective adjacent control terminals between its current limit transistor and said current limit transistor associated with the least significant output of said decoder in the higher-order group adjacent to said one of said groups are connected through resistors, and a respectively generated voltage is supplied to the control terminal of each said current limit transistor.

5. A D/A converter according to claim 3 wherein the reference voltage corresponding to one of said groups is applied to a control terminal of said current limit transistor associated with the least significant output of said decoder in said one of said groups, to the control terminal of said current limit transistor associated with the second least significant output, and to the control terminal of said current limit transistor associated with the most significant output of said decoder in the lower-order group adjacent to said one of said groups, and the respective adjacent control terminals between said current limit transistor associated with the second significant output and said current limit transistor associated with the most significant output of said decoder in said one of said groups are connected through resistors, and a respectively generated voltage is applied to the control terminal of each said current limit transistor.

6. A D/A converter according to claim 3 wherein the reference voltage corresponding to one of said groups is applied to a control terminal of said current limit transistor associated with the least significant output of said decoder in said one of said groups, to the control terminals of said current limit transistors for said driver transistors connected up to the output of an order higher than said least significant output by a predetermined number, and to the control terminals of said current limit transistors for said driver transistors connected up to the output of an order lower than said most significant output of said decoder by a predetermined number in the lower-order group adjacent to said one of said groups, and the respective adjacent control terminals between said current limit transistor associated with the output of an order higher than said least significant output by the predetermined number and said current limit transistor associated with the output of an order lower than said most significant output of said decoder by the predetermined number in said one of said group are connected through resistors, and the respectively generated voltage is applied to the control terminal of each said current limit transistor.

7. D/A converter according to claim 2, wherein one of following supply states of said reference voltage is set for said each group:

a common reference voltage in said each group is applied to control terminals of said current limit transistors associated with said output lines in said each group;

the reference voltage corresponding to one of said groups is applied to a control terminal of said current limit transistor associated with the least significant output of said decoder in said one of said groups, and the respective adjacent control terminals between its current limit transistor and said current limit transistor associated with the least significant output of said decoder in the higher-order group adjacent to said one of said groups are connected through resistors, and a respectively generated voltage is supplied to the control terminal of each said current limit transistor; and the reference voltage corresponding to one of said groups is applied to a control terminal of said current limit transistor associated with the least significant output of said decoder in said one of said groups, to the control terminals of said current limit transistors for said driver transistors connected up to the output of an order higher than said least significant output by a predetermined number, and to the control terminals of said current limit transistors for said driver transistors connected up to the output of an order lower than said most significant output of said decoder by a predetermined number in the lower-order group adjacent to said one of said groups, and the respective adjacent control terminals between said current limit transistor associated with the output of an order higher than said least significant output by the predetermined number and said current limit transistor associated with the output of an order lower than said most significant output of said decoder by the predetermined number in said one of said group are connected through resistors, and the respectively generated voltage is applied to the control terminal of each said current limit transistor.

8. A liquid crystal display device comprising:

a D/A converter for converting digital data read from a frame buffer for each pixel of a display screen to analog data compensated by a gamma compensation, wherein a curve of the gamma compensation is divided to a plurality of ranges sufficient to approximate the curve, said D/A converter including:

a decoder having a plurality of output lines, said decoder generating an output on said plurality of output lines, said output corresponding to said digital data;

a constant current source;

output means connected to said constant current source for providing an output voltage by a flowing current;

a plurality of driver transistors, each connected to one of said plurality of output lines of said decoder and to said constant current source for conducting a current from said constant current source when said connected output line is active;

a plurality of limit transistor, each connected to one of said plurality of driver transistors; and wherein said plurality of output lines of said decoder are grouped correspondingly to each of said plurality of ranges, and a common reference voltage in each group is applied to control terminals of said limit transistors associated with said output lines in each of said groups; and a liquid crystal panel including a circuit which drives each data line using the output voltage of said output means.

9. A liquid crystal display device comprising:

a plurality of D/A converter for converting digital data read from a frame buffer for each pixel of a portion a display screen to analog data compensated by a gamma compensation, wherein a curve of the gamma compensation is divided to a plurality of ranges sufficient to approximate the curve, each said D/A converter including:

a decoder having a plurality of output lines, said decoder generating an output on said plurality of output lines, said output corresponding to said digital data;

a constant current source;

output means connected to said constant current source for providing an output voltage by a flowing current;

a plurality of driver transistors, each connected to one of said plurality of output lines of said decoder and to said constant current source for conducting a current from said constant current source when said connected output line is active;

a plurality of limit transistor, each connected to one of said plurality of driver transistors; and wherein said plurality of output lines of said decoder are grouped correspondingly to each of said plurality of ranges, and a common reference voltage in each group is applied to control terminals of said limit transistors associated with said output lines in each of said groups; and a liquid crystal panel including a circuit which drives data lines associated with the each portion of display screen by using each output voltage of said plurality of D/A converters.

10. A liquid crystal display device comprising:

a plurality of D/A converter for converting digital data read from a frame buffer for each pixel of a portion a display screen to analog data compensated by a gamma compensation, wherein a curve of the gamma compensation is divided to a plurality of ranges sufficient to approximate the curve, each said D/A converter including:

a decoder having a plurality of output lines, said decoder generating an output on said plurality of output lines, said output corresponding to said digital data;

a constant current source;

output means connected to said constant current source for providing an output voltage by a flowing current;

a plurality of driver transistors, each connected to one of said plurality of output lines of said decoder and to said constant current source for conducting a current from said constant current source when said connected output line is active;

a plurality of limit transistor, each connected to one of said plurality of driver transistors; and wherein said plurality of output lines of said decoder are grouped correspondingly to each of said plurality of ranges, and a reference voltage for defining a current limited by said current limit transistors associated with said output lines in each group is supplied to said each group; and a liquid crystal panel including a circuit which drives data lines associated with the each portion of display screen by using each output voltage of said plurality of D/A converters.

* * * * *